United States Patent [19]

Laverty

[11] Patent Number: 4,798,305

[45] Date of Patent: Jan. 17, 1989

[54] ADJUSTABLE SHIPPING TRAY

[75] Inventor: Gerald C. Laverty, Santa Clara, Calif.

[73] Assignee: National Semiconductor Corporation, Santa Clara, Calif.

[21] Appl. No.: 120,881

[22] Filed: Nov. 16, 1987

[51] Int. Cl.[4] ............................................. B65D 85/30
[52] U.S. Cl. .................................. 220/22.3; 220/22.1; 206/334
[58] Field of Search ........................... 220/22.3, 22.1; 206/334, 454, 328

[56] References Cited

U.S. PATENT DOCUMENTS

| | | | |
|---|---|---|---|
| 2,985,333 | 5/1961 | Kirkman | 220/22.3 |
| 3,923,156 | 12/1975 | Wallestad | 206/328 X |
| 4,261,464 | 4/1981 | Maitland | 220/22.3 X |
| 4,427,114 | 1/1984 | Howell et al. | 206/334 X |
| 4,436,215 | 3/1984 | Kleinert et al. | 220/22.3 |
| 4,443,046 | 4/1984 | Hannah | 220/22.1 X |
| 4,499,997 | 2/1985 | Swingley, Jr. | 220/22.3 X |
| 4,574,950 | 3/1986 | Koe et al. | 206/334 |
| 4,696,395 | 9/1987 | Rivoli | 206/334 |
| 4,721,207 | 1/1988 | Kikuchi | 206/334 |

Primary Examiner—Steven M. Pollard
Attorney, Agent, or Firm—Mark Aaker; Lee Patch; Gail W. Woodward

[57] ABSTRACT

A shipping tray that can be adjusted to various internal dimensions, by different placement of one or more moveable partitions. The partitions are held in position by means of interlocking surfaces formed on the ends and bottom of the partition and on the inside walls and interior bottom of the tray.

4 Claims, 6 Drawing Sheets

ADJUSTABLE SHIPPING TRAY

CROSS REFERENCE TO RELATED APPLICATIONS

None.

BACKGROUND OF THE INVENTION

1. Field of the Invention

This invention relates to shipping and storage containers, particularly of a tray shape, with moveable partitions which are pressed into place to allow the tray to be configured for different sizes or quantities of material.

In particular, this invention solves the problems that arose from the need to ship lead frames for integrated circuit manufacturing. As shown in FIG. 1, lead frames are thin metal strips with complex holes and trimmed areas. The strips are generally 0.01 inches thick and from 0.50 to 2.50 inches high, and vary in length from 6 to 10 inches. After plating with gold or silver, the strips are stacked together in a bundle for shipping. For example, 100 strips stacked and wrapped together would form a bundle nominally one inch thick. Because the strips are formed of metal, a bundle of them has substantial weight, and this weight requires special consideration in packing and shipping. Because of the plating, movement within the bundle must be prevented to eliminate scratching of the plated surfaces, and because the ends of the cut strips are delicate, shifting of the bundles within a container during shipment can cause the strips to be bent or deformed.

Therefore, a shipping container was required that could separate and support the bundles, accommodate various sizes and lengths of bundles, and provide sufficient cushioning to prevent damage to the bundled strips.

2. Description of the Prior Art

Shipping of bundles of lead frames was previously done in cardboard boxes. However, damage often occurred to the corners and ends of the bundle, and to the strips on the front and back face of the bundle. Damage occurred even though additional cushioning material was included in the box, because the bundles were packed adjacent to each other. Also, a multitude of box sizes were required for the many sizes and lengths of strips and bundles. Further, the cardboard boxes were often packed together into a larger box, which quickly became excessively heavy, and the weight of the boxes in the top rows damaged the bundles in the bottom rows.

A possible improvement was the divided bin shown in FIG. 2. This bin can hold several bundles and separate the bundles with the flat vertical dividers. However, the limited number of divider positions means the bundles can still rattle around between the dividers, and no adjustment is provided to accommodate the many different lengths of bundles. These bins have been seen only in hard, rigid material which could not provide sufficient shock absorbing and cushioning. Because they are usually reused inside a factory, they have not been made inexpensive enough for discarding after one use, which would be required for use as a shipping container.

Another possible shipping method is illustrated in FIG. 3. This method uses inserts and spacers of cushioning material between the bundles and the box. While this would provide for close contact to support and cushion the bundles, it is not adaptable to multiple sizes of bundles without a multitude of sizes and inserts and boxes.

FIG. 4 shows another possible shipping method. This tray is molded of expanded polystyrene or other stiff but compressible foam or plastic. The formed holes properly support and separate the bundles. The problem with this design is that for every different size of bundle, a different tray is required. Since molds are required for each size, there is considerable expense and manufacturing lead time in preparing molds, and in building an inventory of trays in various sizes. Considerable storage space is also required for many different size trays.

SUMMARY OF THE INVENTION

This invention provides a shipping tray with one or more moveable partitions which are pressed into place to allow the tray to be configured for different sizes or quantities of material. The moveable partitions allow a close fit to the contained bundles for good support and protection. The moveable partitions also allow the tray to accommodate numerous sizes of bundles without requiring a multitude of different sized inserts.

As shown in FIG. 5 the basic shipping tray has a flat bottom, two sets of opposing vertical sides and an open top. One or more moveable partitions fit within the tray from wall to opposing wall, effectively narrowing the inside space of the tray. The moveable partitions can be installed tight against the sides of the bundles of material for maximum support and cushioning, and to restrain the bundles from moving within the tray. In addition, since the moveable partitions can be installed in many positions within the tray, many sizes and lengths of bundles can be accommodated in a single tray design.

The moveable partitions are held in place in the tray by interlocking triangular teeth and grooves formed on the ends of the partition and on the inside walls of the tray, and no additional fastening or locking means are required. The interlocking pattern may also be formed along the bottom of the partition and on the bottom of the tray. The interlocking surfaces may have a multitude of teeth, grooves or channels of square, rectangular, triangular, sawtooth or dovetail shape to perform the interlock. The shape and size of the teeth are adapted to allow the partition to be pressed vertically downward into position in the tray, the interlocking surfaces on the ends sliding past each other in the vertical plane, but resisting movement horizontally.

The teeth on the bottom of the partition and on the interior bottom of the tray will interlock when the partition is fully pressed down into the tray. Thus, the bottom edge, as well as the ends, of the partition will resist horizontal movement so long as the partition remains fully inserted. For even further support, a spacer or block of packing material can be inserted behind the moveable partition, supporting it out from the wall of the tray.

The tray and partition can be made of any of numerous packing materials, but most preferably of a shock resistant, compressible material such as expanded polystyrene.

By this design, the partitions can be installed and held in the proper position for many sizes of material. Support and protection during shipping is improved and the single design serves many sizes of material. In particular, for bundles of lead frames, damage during shipment

DESCRIPTION OF THE PREFERRED EMBODIMENT

Figure 1:
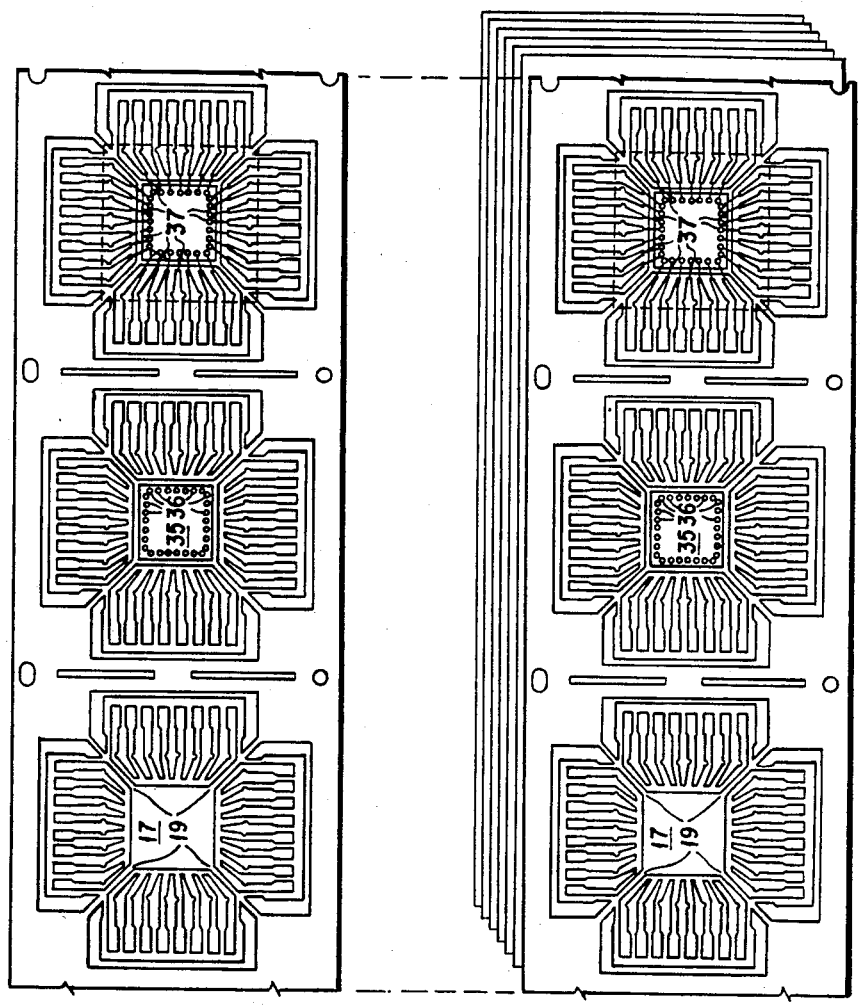
FIG. 1 is a perspective view of a lead frame and a bundle of lead frames for integrated circuit manufacturing.
Figure 2:
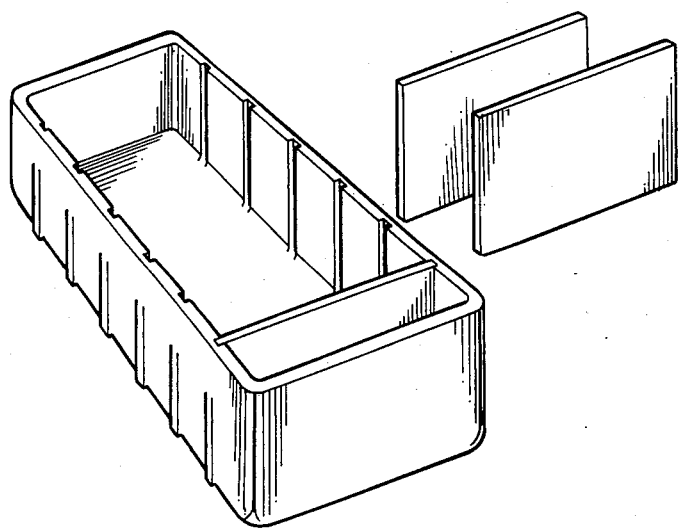
FIG. 2 is a perspective view of a prior art divided bin.
Figure 3:
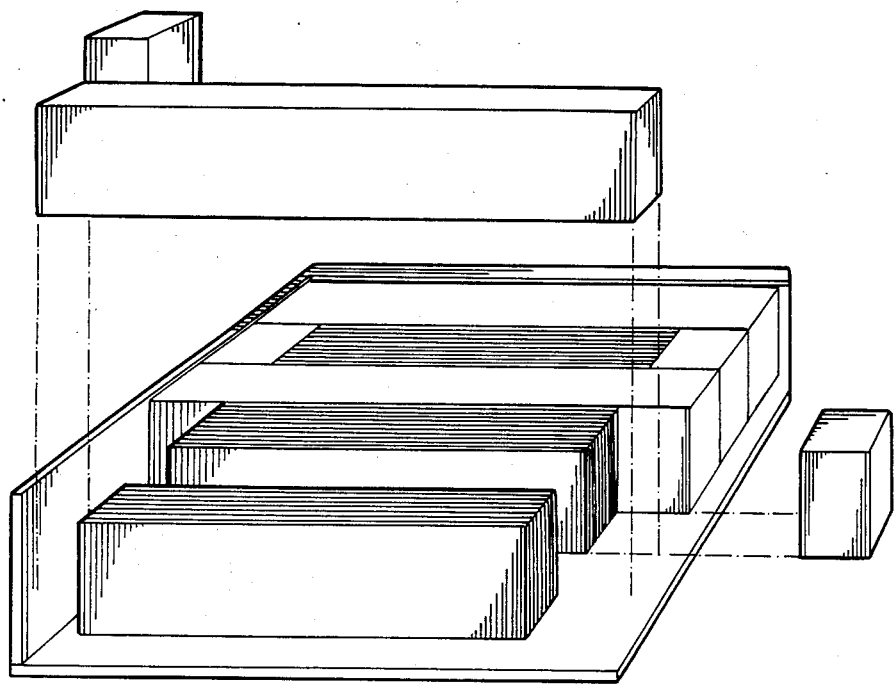
FIG. 3 is a perspective view of a prior art shipping method using inserts and spacers.
Figure 4:
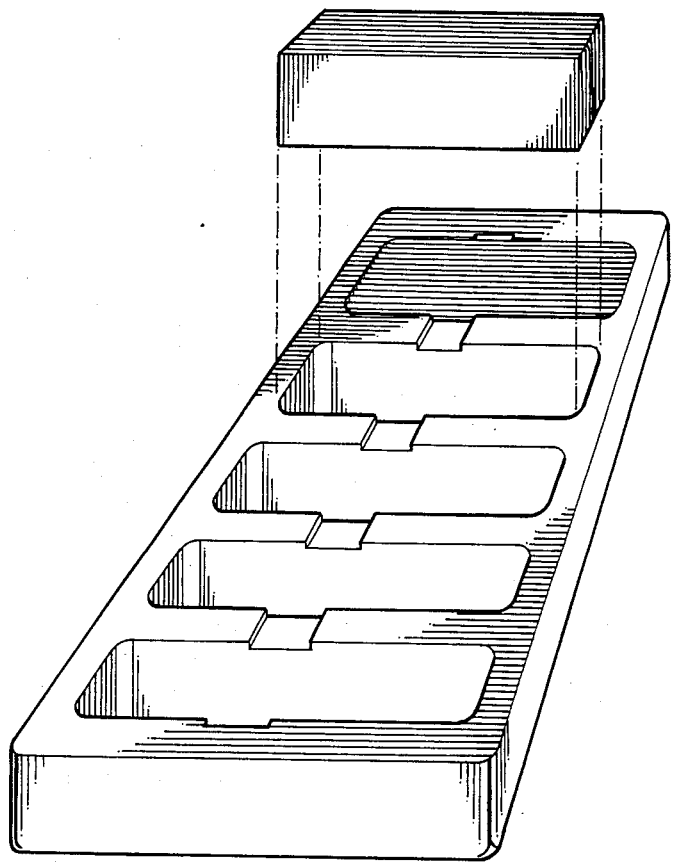
FIG. 4 is a perspective view of a prior art molded tray.
Figure 5:
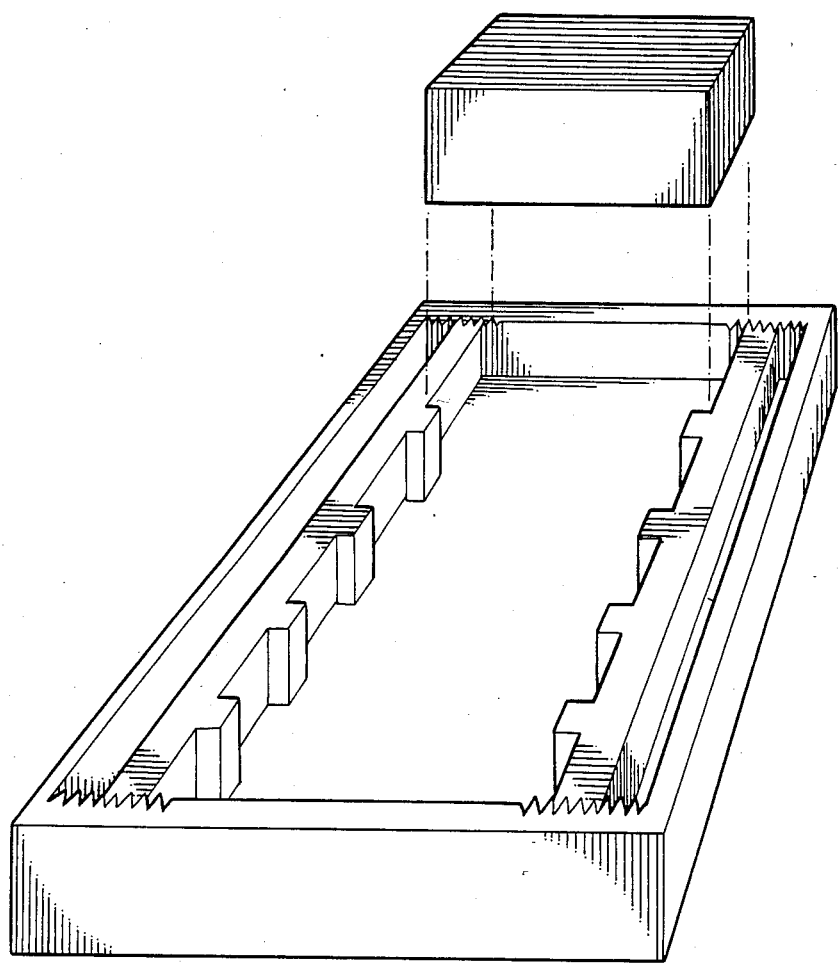
FIG. 5 is a perspective view of a basic adjustable shipping tray, according to this present invention.
Figure 6:
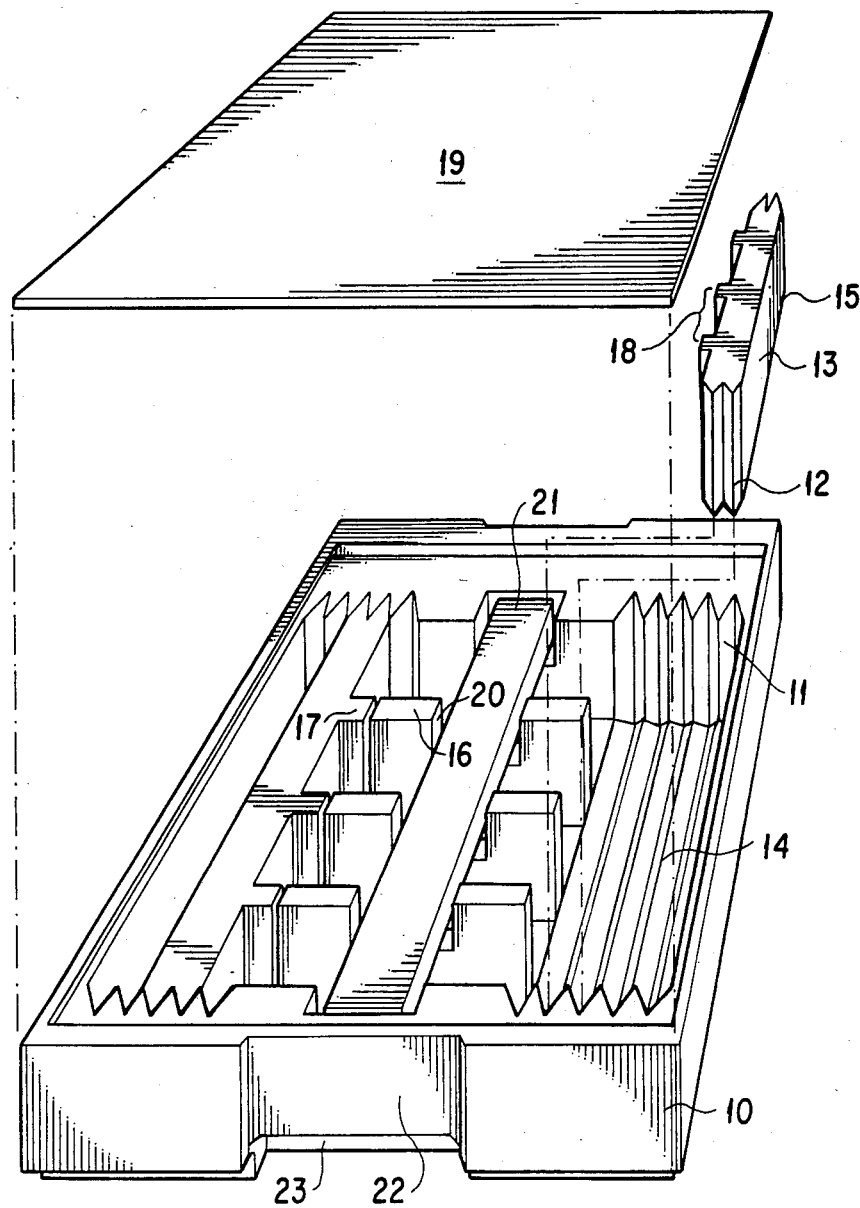
FIG. 6 is a perspective view of a particular embodiment of an adjustable shipping tray, according to this present invention.

FIG. 6 shows a particular embodiment of an adjustable shipping tray according to the present invention. The features of this tray are shown in exaggerated size for clarity. In actual use, the spaces for holding bundles of material would be of larger size.

The tray 10 has an interior bottom surface and a first and second set of opposing vertical walls. One set of opposing walls has its interior face covered with a repeating vertical triangular pattern 11. This pattern 11 interlocks with a matching pattern 12 on the vertical ends of a moveable partition 13. The use of a larger pattern or larger teeth provides greater strength against horizontal movement, but provides fewer fine steps of adjustment range. For a tray of 12 inch inside width, teeth of one-quarter inch pitch have been used satisfactorily.

The inner walls of the tray may be patterned on both the left and right sides. This allows the use of moveable partitions at the left and right sides of the tray simultaneously. This allows the contained material to be centered in the tray for improved balance and protection. The ability to use multiple partitions also allows a wide range of adjustment in the internal dimension. For example, a tray 12 inches wide inside, patterned for 3 inches on both the left and right portions of the inside walls, with two 1 inch wide moveable partitions, provides an adjustment range from 6 inches to 10 inches wide.

FIG. 6 also shows the patterning of the inside bottom surface 14 of the tray 10, to match the bottom edge of the moveable partition 13. This provides further interlock and resistance to horizontal movement when the insert is fully seated downward into the tray.

In the embodiment of FIG. 6, several fixed dividers 16 are formed on the interior bottom surface of the tray. Additional end dividers 17 are formed on one vertical side of the moveable partition 13. Either side can be placed snug against the contained material. When the side with end dividers is faced in, it cooperates with the fixed dividers 16 formed on the bottom of the tray to define separate cells 18 for bundles of materials. These cells are useful in containing specific sizes or numbers of materials. The cells allow quick counting of materials and distribute the weight of the materials across the tray evenly. The dividers introduce packing material between bundles for greater support and protection against damage, and strengthen the tray. In particular, long items will now be supported at the ends abutting the partitions as well as along the middle of the tray.

In a preferred embodiment, the tray 10 and moveable partition 13 are molded from expanded polystyrene. A cover sheet 19 of rigid cardboard or expanded polystyrene is used to hold down the moveable partitions and bundles of material. The cover sheet will be supported by a shelf which is part of the tray side walls, and by the fixed dividers and moveable partitions within the tray. The cover sheet can be recessed below the top of the tray walls, so it does not interfere with stacking of the trays. When stacked, the trays preferably interlock slightly due to a lip and recess formed on the top and bottom of the outside walls of the tray. When stacked, the tray above suffices as a cover for the tray below, or each tray may have its own cover sheet. The cover sheet can be taped, strapped or shrink-wrapped in order to be firmly held down, which will prevent the moveable partitions from rising and becoming unlocked from the interior bottom of the tray.

Where a number of small items are to be stacked and placed in the tray, the moveable partitions can be positioned to match the specific quantity of items shipped, preventing movement of the end item. In this way, a single tray can be used to ship various quantities, without requiring specific full size lots.

This invention also provides that the outside tray dimensions remain constant despite being configured for different internal dimensions. This allows common storage, stacking, shelving, and handling equipment, all adjusted for one size of tray.

One or more notches 20 may be molded in the fixed dividers 16 in the tray. These notches provide a finger hold onto the contained material and allow a hold-down bar 21 to be laid across the items to hold down items shallower than the tray depth.

The outer wall of the tray can be formed with a rectangular indentation 22 for affixing a label. The indentation provides protection against the label being accidentally torn or scraped off. Other indentations 23 in the outer wall of the tray provide finger grips for lifting.

In particular, this adjustable shipping tray has proven useful in shipping integrated circuit lead frames. In use, lead frames of a particular size are counted, stacked, and wrapped in thin paper or plastic. Each such wrapped bundle will occupy one of the cells 18 formed by the fixed dividers 16 and end dividers 17. The moveable partitions 13 will be inserted to fit reasonably snug against the ends of the bundle, and center it within the tray. The use of this adjustable shipping tray has reduced shipping damage over previous methods of shipping in cardboard boxes, and in addition the moveable partitions allow a single tray design to serve for moving and shipping several sizes of lead frames.

From a consideration of the features and flexibility of this invention, changes and modifications will be apparent and can be carried out without departing from the scope of the invention, which is intended to be limited only by the scope of the claims.

What is claimed is:

1. An adjustable tray for holding bundles of material, comprising:

a tray having an planar, solid interior bottom surface, and a first and second pair of opposing vertical walls, each wall having an interior and exterior face; and a moveable partition with first and second vertical sides, top and bottom sides, and first and second vertical ends; and a pattern of alternating vertical grooves and projecting teeth formed on the first and second vertical ends and the bottom side of the moveable partition, and on the interior faces of at least one pair of opposing vertical walls and the interior bottom surface of said tray; whereby, the moveable partition is held within the tray by the interlock of the pattern on the first and second vertical ends with the pattern on the interior faces of the opposing vertical walls, where the alternating verticle grooves and projecting teeth are of an intermeshing triangular shape.

2. The adjustable shipping tray of claim 1 further comprising a plurality of fixed dividers projecting vertically from the interior bottom surface of the tray, for separation and support of the bundles of material.

3. The adjustable shipping tray of claim 1 further comprising a plurality of end dividers projecting horizontally from a vertical side of the moveable partition.

4. An adjustable shipping tray comprising:
a tray with a planar, solid inside bottom surface and front and rear walls, with an inside face of front and rear walls and inside bottom surface covered with a plurality of triangular grooves; and, a moveable partition with front and rear ends and bottom edge covered with a plurality of triangular teeth;

with moveable partition held in place to span from front to rear walls of the tray by the interlock of the triangular teeth with the triangular grooves.

* * * * *